(12) United States Patent
Miyawaki et al.

(10) Patent No.: US 7,236,371 B2
(45) Date of Patent: Jun. 26, 2007

(54) PC CARD

(75) Inventors: Chikanori Miyawaki, Neyagawa (JP); Mikiya Ueda, Kobe (JP); Yoshiaki Akutagawa, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/566,678

(22) PCT Filed: Aug. 25, 2004

(86) PCT No.: PCT/JP2004/012615

§ 371 (c)(1),
(2), (4) Date: Feb. 1, 2006

(87) PCT Pub. No.: WO2005/020047

PCT Pub. Date: Mar. 3, 2005

(65) Prior Publication Data

US 2006/0198109 A1 Sep. 7, 2006

(30) Foreign Application Priority Data

Aug. 26, 2003 (JP) .............................. 2003-300890

(51) Int. Cl.
*H05K 7/02* (2006.01)
(52) U.S. Cl. .................... 361/737; 361/752; 235/492
(58) Field of Classification Search ................ 361/728, 361/737, 730, 736, 752; 439/945, 946; 235/487, 235/492
See application file for complete search history.

(56) References Cited

U.S. PATENT DOCUMENTS

| | | | | |
|---|---|---|---|---|
| 5,038,250 | A * | 8/1991 | Uenaka et al. ............... | 361/737 |
| 5,061,845 | A * | 10/1991 | Pinnavaia ................... | 235/492 |
| 5,242,310 | A * | 9/1993 | Leung ........................ | 439/76.1 |
| 6,075,709 | A * | 6/2000 | Yang .......................... | 361/756 |
| 6,269,005 | B1 * | 7/2001 | Tung et al. ................. | 361/737 |
| 6,333,854 | B1 * | 12/2001 | Sasaoka et al. ............. | 361/737 |
| 6,888,724 | B2 * | 5/2005 | Shaie ......................... | 361/719 |

* cited by examiner

*Primary Examiner*—Dean A. Reichard
*Assistant Examiner*—Dameon E. Levi
(74) *Attorney, Agent, or Firm*—Steptoe & Johnson LLP

(57) ABSTRACT

In a PC card incorporating a printed board, an electronic component having a greater height can be mounted on the printed board without reducing the strength of a cover. The PC card includes a cover member (1) and a main cover (2) at least one of which is formed with at least one opening (2a) for prevention of interference with an electronic component (4), and a plate member (8) closing the opening from the outside of the cover member or the main cover. An outer surface of the plate member (8) is located at substantially the same level as an outer surface of the cover member (1) or the main cover (2), and the plate member (8) has a smaller thickness than the cover member and the main cover. This arrangement increases the strength of the cover.

4 Claims, 3 Drawing Sheets

PC CARD

The present application is based on International Application PCT/JP2004/012615, filed Aug. 25, 2004, which application is incorporated herein by reference in its entirety.

TECHNICAL FIELD

The present invention relates to a PC card structure for use in a portable information processing device or the like.

BACKGROUND ART

With recent evolution of portable information processing devices, various types of PC cards for memories, modems, facsimiles, LAN cards and the like have been commercialized. As higher performance and multi-function are increasingly demanded year by year, the size of an electronic component such as an LSI to be mounted on an inside printed board is increased.

Conventionally, there are various known structures for the PC cards, including a structure such that a printed board mounted with an electronic component such as a memory is incorporated in a frame and covered with a pair of metal covers from upper and lower sides (for example, JP7-160377A).

FIG. 3 is a partial sectional view of a common PC card of the prior art. In FIG. 3, reference numerals 1 and 100 denote an upper cover and a lower cover, respectively. The upper and lower covers are each formed of a thin metal plate, and include a major planar portion and a bend peripheral edge portion.

A reference numeral 3 denotes a printed board, which is composed of a rectangular plate of a synthetic resin. The printed board 3 is disposed between the upper cover 1 and the lower cover 100 in parallel relation, and electronic components 4, 5, 6 are mounted on front and back surfaces of the printed board 3.

A connector 7 is mounted on one edge of the printed board 3. Though not shown, the connector 7 is connected to a slot provided on a host side for signal transmission between the connector 7 and the host side.

A reference numeral 101 denotes a rigid frame molded from a resin. The printed board 3 is fixed in the frame 101 by an adhesive or screws. Further, the upper cover 1 and the lower cover 100 are respectively fixed to front and back sides of the frame 101 by a snap-in method or a fusion bonding method to protect the board 3.

However, the thickness of the PC card is specified to be 5 mm by the Standard. Therefore, if the electronic components 4, 5, 6 mounted on the printed board 3 have greater heights, the thickness of the printed board 3 or the thicknesses of the upper and lower covers 1, 100 should be correspondingly reduced.

Recently, multi-level printed boards have been used for higher density integration, so that the reduction of the thickness of the printed board is often impossible. If the thickness of the printed board is reduced, the printed board is liable to be deformed due to a temperature change or after mounting, thereby failing to ensure sufficient reliability.

Therefore, it is necessary to reduce the thicknesses of the planar portions of the upper and lower covers 1, 100. However, if the thicknesses of the upper and lower covers 1, 100 are reduced, the strength of the covers 1, 100 is correspondingly reduced. Therefore, the covers 1, 100 are liable to be deformed when the planar portions of the covers 1, 100 are pressed or the PC card is dropped. This reduces the reliability. In general, the planar portion of the cover 1 or 100 of the PC card has a shallow recess formed in a surface thereof for application of a label or the like. In this case, the thickness of the thinner planar portion of the cover 1, 100 is further reduced, so that the strength of the cover 1, 100 is further reduced.

DISCLOSURE OF THE INVENTION

In view of the aforesaid drawbacks, it is an object of the present invention to provide a PC card having a cover formed with a recess for application of a label or the like yet having a sufficient strength even if an electronic component having a greater height is mounted on a printed board incorporated in the PC card.

The PC card according to the present invention comprises a printed board mounted with an electronic component, a main cover essentially including a frame and a planar portion for accommodating therein the printed board, a cover member fixed to the main cover and covering the printed board, the main cover having at least one opening formed in the planar portion thereof in opposed relation to the electronic component for prevention of interference with the electronic component, and at least one plate member fixed to close the opening of the main cover and to cover a part of the planar portion of the main cover, wherein the main cover has the openings formed collectively in a predetermined region of the planar portion thereof and a recess formed outside the predetermined region, and the plate member has an outer surface of the plate member located at substantially the same level as an outer surface of the main cover, the plate member having a smaller thickness than the planar portion of the main cover.

In the inventive PC card, the opening is formed in a surface portion of the main cover opposed to the electronic component which has a relatively great height, and covered with the plate member having a smaller thickness than the main cover. Therefore, the main cover is allowed to have a greater thickness and hence an increased strength. Further, the greater height electronic component can be mounted on the printed board. Thus, the PC card has a higher reliability.

Further, according to the present invention, openings are collectively formed in a predetermined region of the main cover, and recesses are formed in outer surfaces of the cover in other region than the predetermined region where the openings are formed. Thereby, the recesses formed in the surface portions of the cover member and the main cover which do not interfere with the electronic component can be utilized as a space for application of a label, a memo sheet or the like.

BEST MODE FOR IMPLEMENTING THE PRESENT INVENTION

Figure 1:
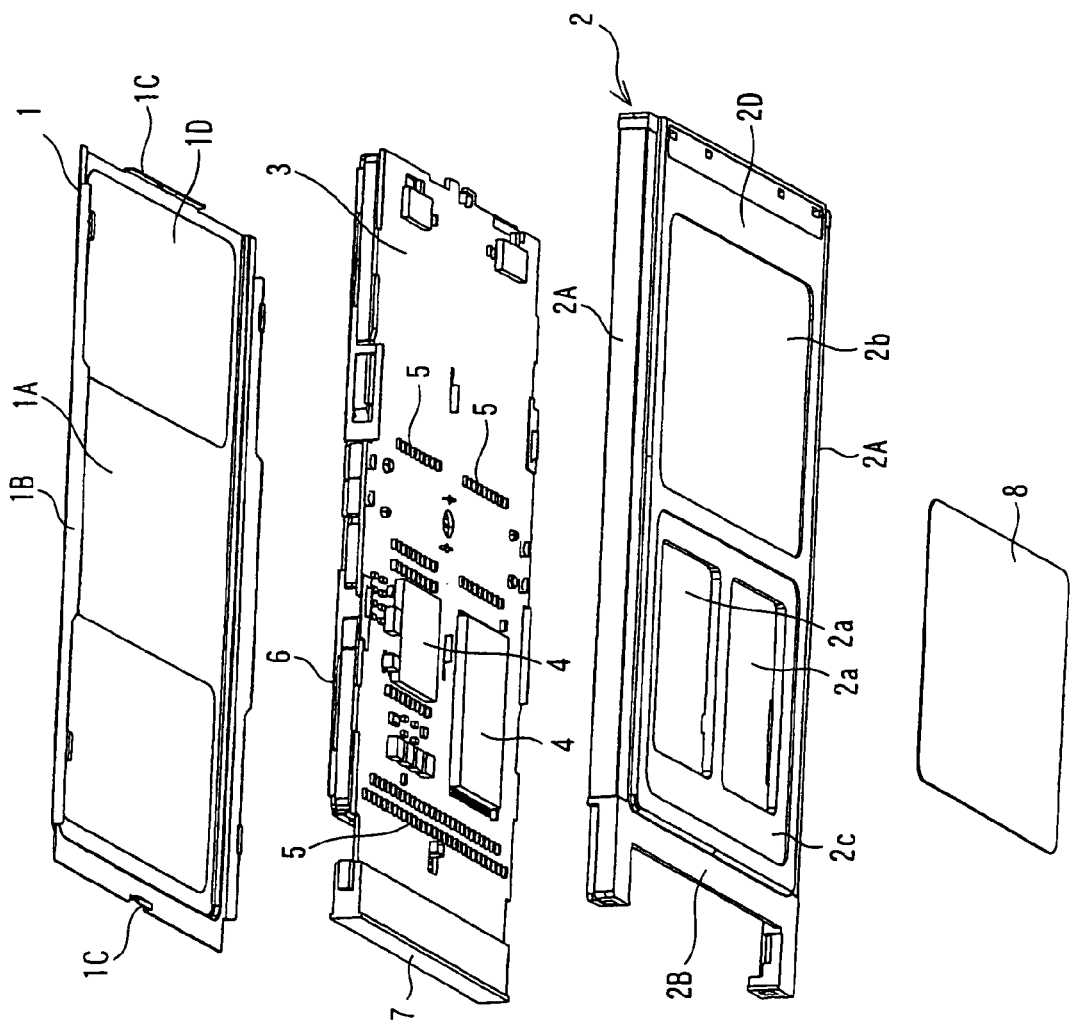
FIG. 1 is an exploded perspective view of an inventive PC card.

According to a first inventive aspect, a PC card comprises a printed board mounted with an electronic component, a main cover essentially including a frame and a planar portion for accommodating therein the printed board, a cover member fixed to the main cover and covering the printed board, the main cover having at least one opening formed in the planar portion thereof in opposed relation to the electronic component so as to prevent interference with the electronic component, and at least one plate member closing the opening of the main cover and fixed to the main cover, wherein an outer surface of the plate member is located at substantially the same level as an outer surface of the main cover, and the plate member has a smaller thickness than the planar portion of the main cover.

With this arrangement, the opening is formed in the main cover in opposed relation to the electronic component which has a relatively great height, so that the interference with the electronic component can be prevented and the main cover is allowed to have a greater thickness. Further, the greater height electronic component is covered with the plate member having a smaller thickness than the main cover. Therefore, the electronic component is allowed to have a greater height.

According to a second inventive aspect, another opening is provided in the cover member covering the main cover so as to prevent interference with the electronic component, and closed with another plate member.

With this arrangement, electronic components each having a greater height can be mounted on opposite surfaces of the printed board in association of the openings, yet the PC card has an increased rigidity.

According to a third inventive aspect, the main cover and the cover member each have a step provided in an outer surface portion thereof around the opening as having a depth substantially equal to the thickness of the plate member. With the provision of the steps, the plate members can be easily fixed to the main cover and the cover member in assembling. Further, when the plate members are pressed from the outside, the plate members are supported by the steps, thereby having an increased strength.

According to a fourth inventive aspect, the planar portion of the main cover and the cover member each have two or more openings, which are closed with a single plate member. The number of components is reduced by closing the two or more openings with the single plate member. Thus, the PC card can be provided at lower costs.

According to a fifth inventive aspect, the openings formed in the planar portion of the main cover and the cover member are collectively provided in a predetermined region of the PC card, and the planar portion of the main cover and/or the cover member has a recess formed outside the predetermined region.

With this arrangement, the recess can be utilized as a space for application of a label, a memo sheet or the like. The openings are collectively provided in the predetermined region, so that the recess can be formed as having a greater area.

According to a sixth inventive aspect, the PC card further comprises a connector mounted on one longitudinal edge of the printed board for signal transmission, and the predetermined region is located within a predetermined distance from the connector.

As described above, the recess is spaced the predetermined distance from the connector, i.e., provided apart from the connector, so that the label or the memo sheet is applied in the vicinity of a rear side of the PC card. Therefore, when information on the label or the memo sheet is to be confirmed with the PC card being inserted in a slot, there is no need to completely withdraw the PC card. Since the label or the memo sheet is applied in the vicinity of the rear side, the information on the label or the memo sheet can be confirmed by withdrawing the PC card halfway from the slot.

Embodiments of the present invention will hereinafter be described with reference to FIGS. 1 and 2.

EMBODIMENT 1

FIG. 1 is an exploded perspective view illustrating the construction of an inventive PC card. FIG. 2 is a partial sectional view of the inventive PC card. The same components as those of the prior art PC card will be denoted by the same reference numerals, and detailed explanation will not be given thereto.

The inventive PC card includes a main cover 2, a cover member 1 closing an upper portion of the main cover 2, and a printed board 3 accommodated in the main cover 2 and covered with the cover member 1.

Figure 2:
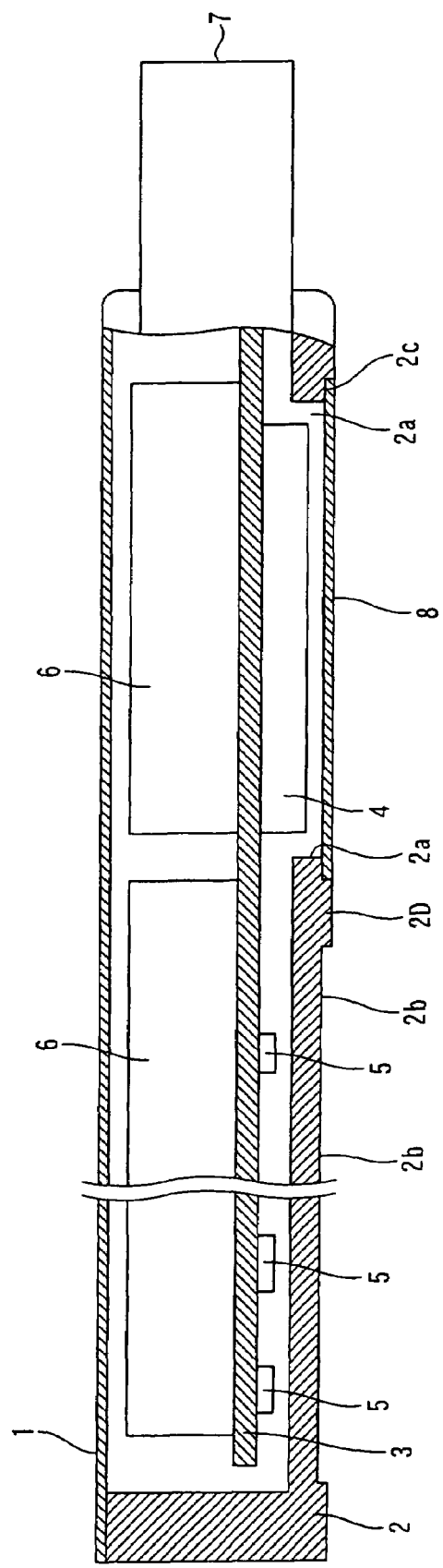
FIG. 2 is a partial sectional view of the inventive PC card.
Figure 3:
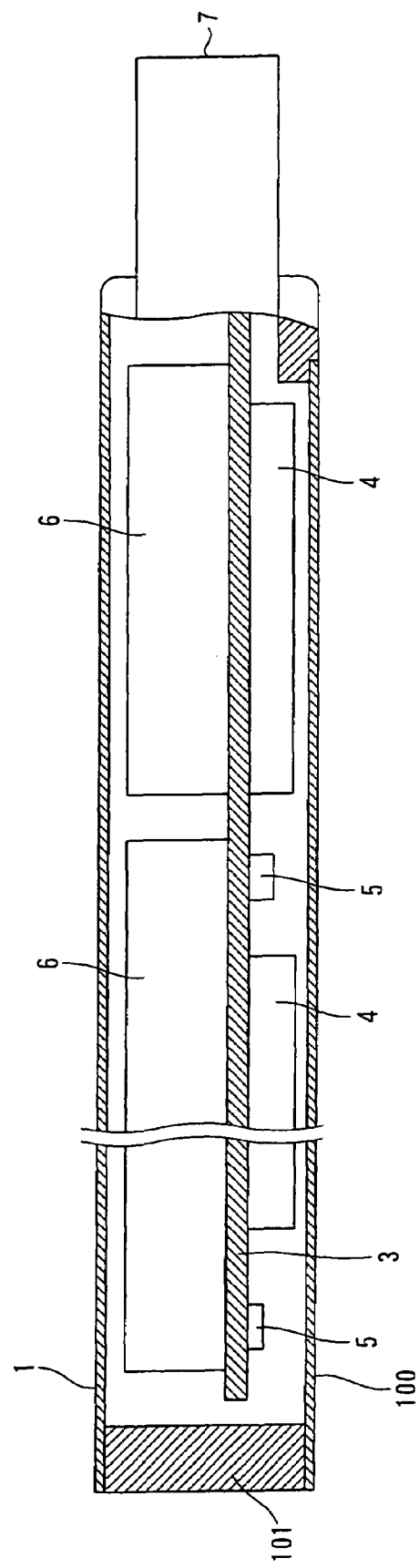
FIG. 3 is a partial sectional view of a prior art PC card.

In FIGS. 1 and 2, the main cover 2 is produced by die-casting, forging, cutting, sintering or pressing a metal, or molding a resin, and has rigidity sufficient to withstand a shock and an external pressure. The main cover 2 includes frame members 2A, bars 2B (only one of which is shown in FIG. 1) extending from opposite ends of one of the frame members 2A to opposite ends of the other frame member 2A, and a planar portion 2D closing a region defined by the frame members 2A and the bars 2B.

The frame members 2A, the bars 2B and the planar portion 2D may be integrally molded, or the planar portion 2D may be provided separately and fixed to the frame members 2A and the bars 2B by an adhesive or screws. The planar portion 2D has a greater strength than the lower cover 100 of the prior art. As will be described later, the planar portion 2D has openings 2a and a recess 2b.

The cover member 1 is fixed to the main cover 2 by a snap-in method or a fusion bonding method, or with the use of an adhesive or screws. The cover member 1 of FIGS. 1 and 2 has substantially the same structure as that of the prior art, and is composed of a rectangular thin metal plate. The cover member 1 includes a major planar portion 1A, a bent peripheral edge portion 1B and a plurality of engagement pieces 1C for fixing the cover member to the main cover 2. The planar portion 1A has a shallow recess 1D for application of a label or the like. However, the cover member 1 is not limited to this prior art structure, but may have substantially the same structure as the planar portion 2D formed with the openings 2a and the recess 2b. The openings 2a are closed by a plate member 8 to be described later. Thus, the PC card has an increased rigidity, and electronic components each having a greater height can be mounted on opposite surfaces of the printed board in association with the openings. In FIG. 1, the main cover 2 and the cover member 1 are respectively located on lower and upper sides of the printed board 3, but may be located in inverted relation.

The printed board 3 is fitted and fixed in the main cover 2. Electronic components 4, 5, 6 are mounted on front and back surfaces of the printed board 3. Particularly, the electronic components 4 are electronic components (e.g., LSIs) each having a greater height. The electronic components 5 are electronic components (e.g., chip components) each having a smaller height.

The openings 2a are formed in the planar portion of the main cover 2 in opposed relation to the greater height electronic component 4 for prevention of interference with the electronic components 4. The main cover has a step 2c formed in an outer surface thereof around the openings 2a as indented from a peripheral surface portion thereof.

The openings 2a are closed by the plate member 8. The plate member 8 is composed of a thin metal or resin plate, and fitted and fixed in the step 2c by a snap-in method or a fusion bonding method, or with the use of an adhesive, an adhesive tape or screws. The step 2c has a depth which is substantially equal to the thickness of the plate member 8 so that an outer surface of the plate member 8 is located at substantially the same level as an outer surface of the main cover 2 (or is generally flush with the outer surface of the main cover 2) with the plate member 8 fixed to the main cover 2. Where the plate member 8 is fixed by an adhesive or a double-sided adhesive tape, the step preferably has a depth which is substantially equal to the thickness of the plate member 8 plus the thickness of the adhesive or the double-sided adhesive tape.

Here, the plate member 8 has a smaller thickness than the planar portion of the main cover 2. With this arrangement, the greater height electronic components 4 can be mounted on the printed board 3 with a proper clearance between the electronic components and an inner surface of the plate member 8 without interference thereof with the main cover 2, because the openings 2a are formed in potions of the main cover 2 opposed to the greater height electronic components 4. On the other hand, a portion of the main cover 2 apart from the electronic components 4 has a relatively great thickness and, as a result, the main cover 2 has an increased strength as compared with a case in which the planar portion 2D has the same thickness as the plate member 8. Further, ribs or the like may be integrally provided on an inner surface of the planar portion 2D without interference with the electronic components, whereby the strength of the main cover 2 is further increased.

In FIG. 1, the number of the openings 2a is two, but a single large opening may be provided. However, the openings 2a preferably each have the smallest possible size, so that a receiving surface of the step 2c fitted with the plate member 8 has a correspondingly wider area. Thus, the plate member 8 is supported by the receiving surface of the step 2c and, therefore, is less liable to be deformed when being pressed from the outside. Rather than the single large opening 2a, the plurality of openings each having the smallest possible size are preferably provided for increasing the area of the receiving surface of the step 2c.

Further, a plurality of plate members 8 may be provided, but the provision of the single plate member 8 reduces the number of components to provide the PC card at lower costs.

The main cover and the plate member 8 are each preferably composed of an electrically conductive material such as a metal and electrically connected to each other by a spring contact or a solder to eliminate electrostatic influences which may otherwise occur when the plate member 8 is fixed to the main cover.

The plate member 8 may be attached to the main cover in the final step of an assembling process. Production numbers such as a serial number and a lot number and warnings may be provided on an outer surface of the plate member 8. The provision of such information may be achieved by a common printing method, a laser etching method or a silk printing method.

EMBODIMENT 2

In FIG. 1, a connector 7 is mounted on one longitudinal edge of the printed board 3. The greater height electronic components 4 are control LSIs or the like. For reduction of influences of noise, the electronic components 4 are collectively mounted on the printed board 3 in a predetermined region within a predetermined distance from the connector 7. As a result, the openings 2a are also collectively provided in the planar portion 2D of the main cover 2 within the predetermined distance from the connector 7.

The region formed with the openings 2a is, for example, a region of the PC card spanning from a longitudinal middle to the connector 7 (i.e., an about one-half region of the PC card closer to the connector) as shown in FIG. 1. Alternatively, the region may be an about one-third region of the PC card closer to the connector 7 or an about two-third region of the PC card closer to the connector 7.

On the other hand, the recess 2b is provided in a portion of the outer surface of the main cover 2 not formed with the openings 2a, i.e., in a rear portion of the outer surface of the main cover apart from the connector 7 as indented from the peripheral surface portion of the main cover.

The provision of the recess 2b permits application of a label, a memo sheet or the like. With the provision of the recess 2b in the rear portion apart from the connector 7, information on the label can be confirmed by withdrawing the PC card halfway from the slot without completely withdrawing the PC card from the slot in this embodiment. Thus, the PC card is conveniently used.

INDUSTRIAL APPLICABILITY

The PC card according to the present invention is particularly useful for a portable information processing device which is roughly handled.

The invention claimed is:

1. A PC card comprising:
    a printed board having an electronic component mounted thereon;
    a main cover comprising a frame and a planar portion for accommodating therein the printed board;
    a cover member fixed to the main cover and covering the printed board;
    the main cover having at least one opening in a predetermined region of the planar portion thereof in opposed relation to the electronic component to prevent interference with the electronic component; and
    at least one plate member fixed to close the opening of the main cover and to cover a part of the planar portion of the main cover, wherein the main cover also has a recess formed outside the predetermined region, and the plate member has an outer surface at substantially the same level as an outer surface of the main cover, the plate member having a smaller thickness than the planar portion of the main cover;
    the main cover also having another opening to prevent interference with the electronic component, on which another opening is closed with another plate member, and the main cover and the cover member each having a step in an outer surface thereof, surrounding the opening and having a depth substantially equal to the thickness of the plate member.

2. The PC card of claim 1, wherein the openings are in a predetermined region of the cover member.

3. The PC card of claim 2, further comprising a connector mounted on one longitudinal edge of the printed board for signal transmission, and the predetermined region is located within a predetermined distance from the connector.

4. A PC card comprising:
    a printed board having an electronic component mounted thereon;

a main cover comprising a frame and a planar portion for accommodating therein the printed board;

a cover member fixed to the main cover and covering the printed board;

the main cover having two or more openings in a predetermined region of the planar portion thereof in opposed relation to the electronic component to prevent interference with the electronic component; and a plate member fixed to close the openings of the main cover and covering a part of the planar portion of the main cover, and a recess formed outside the predetermined region, the plate member having an outer surface at substantially the same level as an outer surface of the main cover, the plate member having a smaller thickness than the planar portion of the main cover, the main cover also having another opening to prevent interference with the electronic component, on which another opening is closed with another plate member, and the main cover and the cover member each having a step in an outer surface thereof, surrounding the opening and having a depth substantially equal to the thickness of the plate member, and the relationship between the distance from the printed board to a surface of the electronic component, the distance from the print board to an inner surface of the main cover, and the distance from the print board to the plate member is $h1 \leqq h < h2$.

* * * * *